United States Patent [19]
Konishi et al.

[11] Patent Number: 4,466,009
[45] Date of Patent: Aug. 14, 1984

[54] LIGHT-ACTIVATED SEMICONDUCTOR DEVICE WITH OPTIC FIBER MOVEABLE AZIMUTHALLY AND TRANSVERSELY

[75] Inventors: Nobutake Konishi, Hitachiota; Mutsuhiro Mori; Tomoyuki Tanaka, both of Hitachi, all of Japan

[73] Assignee: Hitachi, Ltd., Tokyo, Japan

[21] Appl. No.: 322,698

[22] Filed: Nov. 18, 1981

[30] Foreign Application Priority Data

Nov. 21, 1980 [JP] Japan .................. 55-163350

[51] Int. Cl.³ ........................................... H01L 27/14
[52] U.S. Cl. ......................................... 357/30; 357/79; 357/80; 357/38; 350/96.2; 350/96.21
[58] Field of Search ................. 357/30, 30 D, 79, 80, 357/38; 350/96.2, 96.21

[56] References Cited

U.S. PATENT DOCUMENTS

| 4,166,668 | 9/1979 | MacLeod .................. 350/96.2 |
| 4,207,587 | 6/1980 | Hanes et al. .............. 357/30 X |
| 4,288,143 | 9/1981 | Di Vita .................... 350/96.21 |
| 4,302,070 | 11/1981 | Nakayama et al. ......... 350/96.2 |

FOREIGN PATENT DOCUMENTS 58369  4/1982  Japan ........................... 357/30

Primary Examiner—Martin H. Edlow
Assistant Examiner—W. Mintel
Attorney, Agent, or Firm—Antonelli, Terry & Wands

[57] ABSTRACT

In a light-activated semiconductor device wherein a light-activated semiconductor element accommodated in a package is driven by a light signal fed from an external light source into the package through an optical guide, the optical guide comprises a first portion passing through the package and a second portion for optically coupling the first portion and the light-activated element.

17 Claims, 6 Drawing Figures

LIGHT-ACTIVATED SEMICONDUCTOR DEVICE WITH OPTIC FIBER MOVEABLE AZIMUTHALLY AND TRANSVERSELY

This invention relates to a light-activated semiconductor device of the structure in which a light activated-semiconductor element accommodated in a package and a light source outside the package are optically coupled by an optical guide.

In general, a semiconductor device driven by a light signal, for example, a light-triggered type thyristor (hereinafter, referred to as light-activated thyristor) has such advantages as compared with a thyristor driven by an electrical signal that (1) since a main circuit including the thyristor and a drive circuit for the thyristor are electrically isolated from each other, the drive circuit can be simplified in its construction and that (2) the thyristor does not malfunction in response to noise from electromagnetic induction. For these reasons, recently the light-activated thyristor for example, has been tried to be used in a thyristor converter for high voltage DC transmission for which the above advantages are expected to be more effective. In this application, since a large light-activated thyristor is used for high voltages, the light-activated thyristor and the light source for generating a drive signal are separated by a certain distance and optically coupled by an optical guide such as an optical fiber or the like. Since the thyristor is constructed by a thyristor element having chiefly a semiconductor substrate sensitive to the environment and a package for accommodating therein and hermetically sealing the thyristor element, one encounters the following problem when the light signal is conducted into the package through the optical guide. That problem is how to conduct the optical guide to the light receiving or light-sensitive surface of the thyristor element with high efficiency, good workability and high reliability while keeping the hermetically sealing ability of the package.

One structure for conducting the optical guide in the light-activated thyristor of this type has been proposed in U.S. Pat. No. 4,131,905. An aperture is provided in part of an insulating cylinder of the package which includes a pair of leading electrodes and the insulating cylinder for electrically insulating the leading electrodes. The optical guide is passed through this aperture and one end of the optical guide extends to the light receiving surface of the light-activated thyristor element. That portion of the optical guide in the aperture of the insulating cylinder is hermetically sealed by a sealing material, and the end of the optical guide and the light receiving surface of the light-activated thyristor element are secured by an adhesive so that a light signal through the optical guide is incident on the light receiving surface with high efficiency.

The light-activated thyristor of such construction has the following drawbacks. First, the workability in assembling of the light-activated thyristor is poor. In other words, it is necessary that the end of the optical guide and the light receiving surface of the light-activated thyristor be secured by the adhesive in alignment relation with each other while substantially at the same time the aperture of the insulating cylinder through which the optical guide is passed be hermetically sealed. Both of these working operations are difficult to perform with high accuracy. Second, there is a great possibility that the light-activated thyristor element is broken down. Namely, since the optical guide portion within the package is secured to both the insulating cylinder of the package and the light-activated thyristor element, any stress, vibration, shock or the like exerted upon the assemblage after securing or after assembling may break the secured portion. A further problem arises in a semiconductor device in which a large current is flowed. Such a semiconductor device sometimes employs the so-called press contacting scheme in which the leading electrodes and the semiconductor element are electrically and thermally well connected, without securing through an adhesive, by means of only a contact mechanism therebetween through the application of a pressing force from the exterior of the package. If this scheme is used in the conventional light-activated thyristor, the application of the pressing force would cause a slight displacement of the light-activated thyristor in the direction of the pressing force, thereby breaking the secured portion of the optical guide.

The above breakage of the secured portion may be easily caused, particularly when the optical guide in the package is made of a rigid body such as a quartz glass rod. The optical guide in the package is required to withstand the temperature rise upon manufacture of the light-activated thyristor or upon current flowing therein, for example, a temperature of about 200° C. and not to generate any undesirable gas upon the temperature rise. At present, only an optical guide made of inorganic material such as quartz glass meets such requirements, but such an optical guide is fragile and is easily broken.

The foregoing problems are involved not only in the light-activated thyristors but in general are present in light-activated semiconductor devices of the structure in which the optical guide is disposed to extend to the light-activated semiconductor element accommodated in the package.

Accordingly, it is an object of this invention to provide an improved light-activated semiconductor device which is free of the above drawbacks. In particular, the object of the invention is to provide a light-activated semiconductor device of the structure in which an optical guide can be mounted in a package with good workability and the optical guide or that portion of the optical guide to which another member is secured is not easily broken down.

In a light-activated semiconductor device according to this invention, an optical guide is formed of a first portion passing through a package and a second portion for optically coupling the first optical guide portion and a light receiving or light-sensitive surface of a light-activated semiconductor element, one end of the first optical guide portion and one end of the second optical guide portion being coupled in a mechanically flexible relation with each other, and the other end of the second optical guide portion being made in contact with the light receiving surface of the light-activated semiconductor element. The optical guide is made of inorganic material such as quartz glass. It is preferable that a transparent elastic resin is interposed between the end faces of the opposed ends of the first and second optical guide portions and/or between the end face of the other end of the second optical guide portion and the light receiving surface, thereby improving the light coupling efficiency.

The other objects and features of this invention will become more readily understood from the description of preferred embodiments taken with the accompanying drawings, in which.

Figure 1:
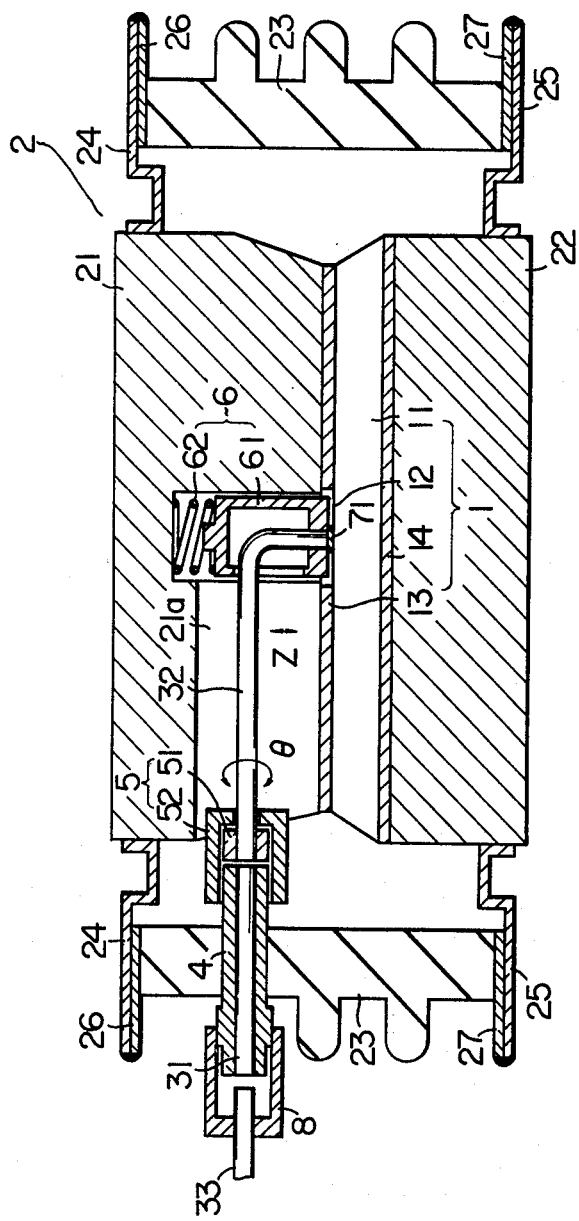
FIG. 1 is a schematically cross-sectional view of a light-activated thyristor to which the invention is applied.

FIG. 1 shows a light-activated thyristor of generally disk-like shape to which this invention is applied. Reference numeral 1 represents a light-activated thyristor element comprising at least a semiconductor substrate 11 having a predetermined PN junction therein, a cathode electrode 13 formed on one principal surface of the semiconductor substrate 11 excepting a light receiving or light-sensitive surface 12 thereof, and an anode electrode 14 formed on the other principal surface of the semiconductor substrate 11. If necessary, on both principal surfaces or one principal surface of the semiconductor substrate 11 may be attached a reinforcing plate made of a material such as molybdenum or tungsten with a coefficient of thermal expansion approximately equal to that of the substrate 11, and a surface stabilizing or passivating material may be covered on the exposed surface of the semiconductor substrate 11. Reference numeral 2 represents a package for accommodating therein and hermetically sealing the light-activated thyristor element 1. This package 2 includes cathode and anode leading electrodes 21 and 22 which are provided in good electrical and thermal coupling with the cathode and anode electrodes 13 and 14 of the light-activated thyristor element 1 respectively, a cylinder 23 (made of, for example, ceramic) which provides an electrical insulation between the leading electrode 21 and the leading electrode 22, flanges 24 and 25 which are secured to the side peripheral faces of the leading electrodes 21 and 22 respectively, and flanges 26 and 27 which are secured at their inner surfaces to the ends of the insulating cylinder 23 and welded at their entire outer surfaces to the flanges 24 and 25 respectively to achieve a hermetical sealing. The leading electrodes 21 and 22 are electrically and thermally coupled to the light-activated thyristor element 1 by adhesion or contact. In this case, between the light-activated thyristor substrate and each of the cathode and anode leading electrodes may be interposed a buffer plate made of a material whose coefficient of thermal expansion is approximately equal to that of the semiconductor substrate 11.

Reference numeral 4 represents a connector sleeve passing through the insulating cylinder 23 and hermetically secured to the cylinder 23. In the center portion of the connector sleeve 4 is hermetically inserted a first optical guide portion 31 formed of an inorganic material. One end of a second optical guide portion 32 made of an inorganic material is coupled by a connecting jig 5 to the connector sleeve 4 in such a manner as to have a mechanical flexibility so that it opposes one end of the first optical guide portion 31. The other end of the second optical guide portion 32 abuts at a predetermined pressure against the light receiving surface 12 of the semiconductor substrate 11 by a pressing jig 6 through a layer 71 of transparent elastic resin such as silicone resin. The cathode leading electrode 21 has a recess 21a formed therein for guiding the second optical guide portion 32, the connecting jig 5 and the pressing jig 6. Numeral 33 represents an optical fiber for optically connecting a light source (not shown) and the other end of the first optical guide portion 31. This optical fiber 33 is detachably coupled to the outer end of the connector sleeve 4 by a connecting jig 8.

The light-activated thyristor having the above-described construction is assembled by the following processes.

First, the insulating cylinder 23 having the flanges 26 and 27 silver-brazed to its opposite ends is hermetically silver-brazed to the connector sleeve 4. In this case, it is preferable that the connector sleeve 4 is made of a material approximately equal in coefficient of thermal expansion to the insulating cylinder 23. For example, when the insulating cylinder 23 is made of ceramic, the connector sleeve 4 is preferably made of Fe-Ni or Fe-Ni-Co material. Second, the first optical guide portion 31 is passed through an aperture provided in the connector sleeve 4 and hermetically secured thereto with an adhesive such as epoxy system resin or solder adherent to glass. Alternatively, glass powder may be applied and melted to provide a hermetical sealing.

The insulating cylinder 23 is then combined with the anode leading electrode 22 having the flange 25 silver-brazed thereto, and arc-welding is carried out at the outer peripheries of the flanges 25 and 27, thereby providing a hermetical securing to form a part of the package. On the leading electrode 22 at the bottom of this part of package is placed the light-activated thyristor element 1. The light-activated thyristor element 1 may be made to adhere to the leading electrode 22 through a supporting plate made of tungsten or molybdenum. Then, the second optical guide portion 32 including an L-shaped quartz rod of, for example, about 1 mm diameter is disposed between the first optical guide portion 31 and the light receiving surface 12 of the light-activated thyristor element 1. One end of the second optical guide portion 32 is securely attached with a ring member 51 around which is provided an engaging member 52 of a U-shaped cross-section made of, for example, tetrafluoroethylene. This engaging member 52 is used for coupling the first optical guide portion 31 and the second optical guide portion 32 with their optical axes aligned by fitting the connector sleeve 4 into the engaging member 52. The other end of the second optical guide portion 32 is fixed by a support member 61 and placed through the transparent resin layer 71 on the light receiving surface 12 of the light-activated thyristor element 1.

Then, the cathode leading electrode 21 with the flange 24 silver-brazed thereto is placed on the part of the package so as to close its opening portion and make the second optical guide portion 32 be positioned in the recess 21a. Thereafter, the flanges 24 and 26 are arc-welded at their outer peripheries, thereby completing a light-activated thyristor to which this invention is applied. In this case, between the recess 21a and the support member 61 is interposed an elastic body 62 for applying a predetermined pressure to cause the other end of the second optical guide portion 32 to abut against the light receiving surface 12 of the light-activated thyristor element 1.

According to this embodiment, two separate optical guide portions, one passing through the package and the other disposed within the package, are provided as the first and second optical guide portions 31 and 32, the first and second optical guide portions 31 and 32 are coupled in a mechanically flexible relation with each other, and a contact structure or relation is provided between the second optical guide portion 32 and the light receiving surface 12. Therefore, even if any force is applied on the second optical guide portion 32, it will be absorbed at the coupling and contacting portions so as to prevent breaking of the optical guide.

Further, the connector sleeve 4 for supporting the first optical guide portion 31 can be hermetically secured to the insulating cylinder 23 independently of the working operation for mounting the second optical guide portion 32, which eliminates the difficulty encountered upon manufacture of the prior art device due to the requirement that the hermetical sealing of the optical guide with the insulating cylinder and the positioning of the optical guide in alignment with the light-activated thyristor must be carried out substantially at the same time.

Furthermore, since the coupling portion between the second optical guide portion 32 and the connector sleeve 4 is rotatable in the direction of $\theta$ and allows movement in the Z direction, it is easy to align the second optical guide portion 32 with the light receiving surface 12 of the light-activated thyristor element 1.

Moreover, since the second optical guide portion 32 is detachably mounted to the connector sleeve 4 and the light receiving surface 12, the light-activated thyristor element 1 and/or the second optical guide portion 32 can easily be replaced by new one(s).

Figure 2A:
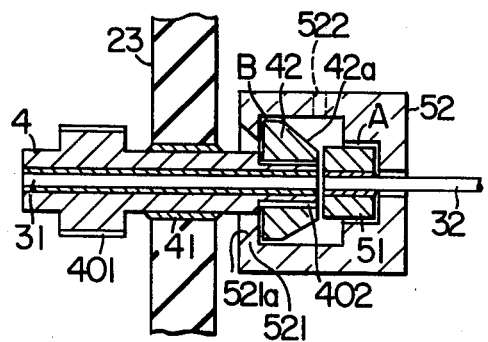
FIGS. 2a and 2b are schematically cross-sectional views of modifications of a coupling structure for coupling the first and second optical guide portions.
Figure 2B:
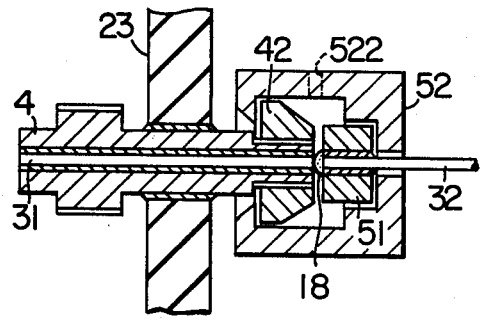

FIGS. 2a and 2b show modifications of the coupling portion between the connector sleeve 4 and the second optical guide portion 32.

Referring to FIG. 2a, the connector sleeve 4 is inserted through the aperture of the insulating cylinder 23 from the outside of the package 2, and then hermetically secured to the insulating cylinder 23 by a silver brazer 41. Numeral 401 denotes a thread portion provided at a large-diameter portion of the connector sleeve 4 on the outside of the package 2, and numeral 402 another thread portion provided at the end portion of the sleeve 4 within the package 2. Then, a nut (a large-diameter member) 42 with a tapered surface 42a is engaged with the threaded end portion of the connector sleeve 4 within the package 2. Subsequently, the first optical guide portion 31 is inserted in the connector sleeve 4 and hermetically secured thereto. The light input end of the second optical guide portion 32 is inserted through the engaging member 52 made of tetrafluoroethylene, and thereafter the ring member (a large-diameter member) 51 of metal or insulator is secured to the light input end of the second optical guide portion 32. The engaging member 52 has a hook 521 formed at its tip end for engagement with the nut 42. This hook 521 has a tapered surface 521a. Thus, when the hook 521 is pressed against the nut 42, it can easily and accurately be engaged therewith. Since the engaging member 52 is shaped to precisely align with the ring member 51 at location A and the nut 42 at location B, the optical axis of the first optical guide portion 31 can precisely be aligned with that of the second optical guide portion 32 by the above engagement. Therefore, the light coupling loss due to the deviation between both the optical axes can be prevented, thereby increasing the light coupling efficiency. If the engaging member 52 is of cylindrical shape and has at its hook side a plurality of cuts formed in the axial direction, the member 52 can be engaged with and disengaged from the nut 42 with ease. Moreover, if the engaging member 52 has an observing hole 522 formed at a position corresponding to the clearance between the opposed ends of the first and second guide portions 31 and 32, the alignment between the optical axes of both the optical guide portions can be monitored through the observing hole so as to be performed with accuracy.

FIG. 2b shows the structure of the coupling portion between the connector sleeve 4 and the optical guide portion 32, which structure enables a higher light coupling efficiency to be achieved. The structure of FIG. 2b is different from that of FIG. 2a in that an elastic transparent resin layer 18 is coated on the end face of one end (light input end) of the second optical guide portion 32 and abuts against the one end of the first optical guide portion 31. Consequently, the reflection of light at the end faces of the opposed ends of the first and second optical guide portions 31 and 32 is reduced, thereby increasing the light coupling efficiency. Alternatively, the resin layer 18 may be coated on the end face of the one end of the first optical guide portion 31 or the end faces of the opposed ends of both the guide portions 31 and 32 to obtain the same effect.

Figure 3A:
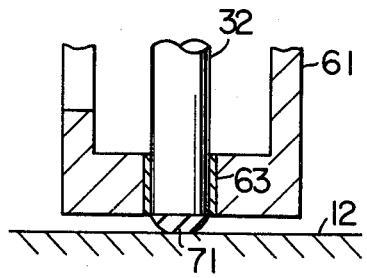
FIGS. 3a to 3c are schematically cross-sectional views of modifications of a supporting structure for supporting the light output end of the second optical guide portion.
Figure 3B:
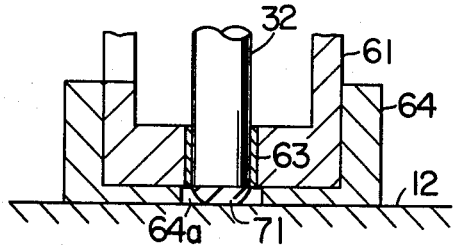
Figure 3C:
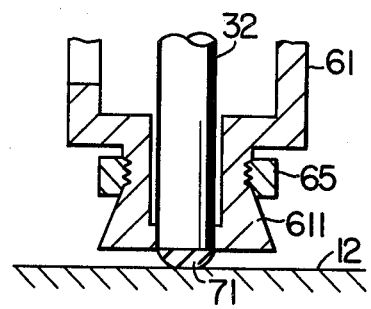

FIGS. 3a to 3c show modifications of the supporting structure for supporting the other end (light output end) of the second optical guide portion 32.

In FIG. 3a, the second optical guide portion 32 is secured to the support member 61 by an adhesive 63 of heat-resistant organic material or glass.

FIG. 3b shows a structure for providing a fixed gap between the other end of the second optical guide portion 32 and the light receiving surface 12. At the end of the support member 61 opposite to the light receiving surface 12 is provided an insulating cap or spacer 64 having an opening 64a for light irradiation. The thickness of the insulating cap 64 at its opened side defines a gap between the second optical guide 32 and the light receiving surface 12. The present modification improves the reproducibility of light-activated thyristors of uniform light coupling efficiency between the second optical guide portion 32 and the light-activated thyristor element. The function of the insulating cap 64 may be also realized by a proper shaping of the support member 61.

FIG. 3c shows one example of mechanically securing the second optical guide portion 32 to the support member 61 without any adhesive. The end portion of the support member 61 opposite to the light receiving surface 12 is vertically cut into a plurality of segments which spread out toward the light receiving surface 12 like a taper shape. In addition, threads are formed on the outer peripheries of the taper-like segments. Thus, the end portion of the support member 61 results in a male threaded portion 611 whose diameter of the end near the light receiving surface 12 can be adjusted by engaging a female nut 65 with the male threaded portion 611 so that the second optical guide portion 32 is tightened to fix to or detached from the support member 61. The feature of this structure is that the support member 61 and the second optical portion 32 are in contact with each other at only the respective parts of their ends near the light receiving surface 12. Since the light propagating within the optical guide leaks at the contact portion between the optical guide and another member, it is preferable that the optical guide is supported at an area thereof as small as possible. Therefore, the structure of FIG. 3c, as compared with those of FIGS. 3a and 3b, has a reduced light loss within the second optical guide portion 32 and thus can improve the light coupling efficiency.

The support member 61 in FIGS. 3a to 3c, when the semiconductor substrate 11 of the light-activated thyristor element is made of silicon, is preferably made of a metal selected from aluminum, copper, silver and gold. For the silicon semiconductor substrates, it is preferable to use a light signal having a wavelength ranging from 0.88 μm to 1.00 μm because it provides a high photoelectric conversion efficiency. Materials providing high reflectivity at this range of wavelength, include aluminum, copper, silver and gold. Therefore, the use of such a material for the support member reduces the light loss at the contact portion between the support member and the optical guide.

The semiconductor device according to this invention will hereinafter be described by use of numerical examples.

The light transmission efficiency of the optical guide section from the other end (light input end) of the first optical guide portion 31 to the other end (light output end) of the second optical guide portion 32 in the structure shown in FIG. 1 was 93.1% when that of a comparable optical guide of a unitary structure assuming the first and second optical guide portions 31 and 32 are integrally formed is assumed to be 100%. The efficiency of 93.1% shows that the division of the optical guide does not substantially deteriorate the light transmission effiency. Moreover, when the transparent resin layer 18 of silicone rubber was interposed between the first and second optical guide portions 31 and 32 at the coupling portion as shown in FIG. 2b, the light transmission efficiency of the same optical guide section from the light input end to the light output end as set forth above was 99.8%. From these results, it will be understood that the division of the optical guide will result in substantially no reduction in the light transmission efficiency.

When the other end (light output end) of the second optical guide portion 32 was supported by the support member 61 of aluminum as shown in FIG. 3c, the light transmission efficiency showed the same value as in the case when it was not supported at all. In this ccnnection, when the support member of stainless steel was bonded to the other end of the second optical guide portion 32 by ceramic, the light transmission efficiency was 50% of the value in the case when it was not supported at all.

When nothing was interposed between the second optical guide portion 32 and the light receiving surface 12, the light loss due to the reflection of light from the light receiving surface 12 was about 30%, whereas the light loss in the case when the transparent resin layer 71 of silicone rubber was interposed therebetween was 5%.

Though the light-activated thyristor housed in a flat-type package has been described above, it is of course possible that this invention is applicable to any light-activated semiconductor device which has an optical communication structure between a light-activated semiconductor device accommodated in a package and an external light source.

What is claimed is:

1. A light-activated semiconductor device comprising:
   a light-activated semiconductor element having a predetermined junction structure formed therein and a light receiving surface provided at a part of its surface;
   a package for hermetically accommodating said light-activated semiconductor element;
   a first optical guide portion of inorganic material which passes through said package and is hermetically secured thereto; and
   a second optical guide portion of inorganic material which is disposed within said package and has one end thereof coupled in a mechanically flexible relation with one end of said first optical guide portion within said package and the other end thereof made in contact with said light receiving surface of said light-activated semiconductor element.

2. A light-activated semiconductor device according to claim 1, wherein the end face of said other end of said second optical guide portion is coated with a transparent elastic resin and abuts against said light receiving surface of said light-activated semiconductor element through said transparent elastic resin by a pressing means.

3. A light-activated semiconductor device according to claim 2, wherein at least one of the end faces of said one end of said first optical guide portion within said package and the end face of said one end of said second optical guide portion is coated with a transparent elastic resin, both said end faces being in contact with each other through said transparent elastic resin.

4. A light-activated semiconductor device comprising:
   a light-activated semiconductor element including a semiconductor substrate which has a predetermined PN junction between a pair of opposite principal surfaces thereof and a light receiving surface provided at a part of one of said principal surfaces, and a pair of electrodes which are formed on parts of said one principal surface other than said light receiving surface part thereof and on the other principal surface respectively;
   a package having a pair of leading electrodes electrically connected to said pair of electrodes of said light-activated semiconductor element respectively, and an insulating member for providing an electrical insulation and a hermetical sealing between the leading electrodes, said package accommodating therein said light-activated semiconductor element;
   a first optical guide portion of inorganic material which passes through said insulating member of said package and is hermetically secured thereto, said first optical guide portion guiding a light signal from an external light source into the interior of said package; and
   a second optical guide portion of inorganic material which is disposed within said package and has one end thereof coupled in a mechanically flexible relation with one end of said first optical guide portion within said package and the other end thereof made in contact with said light receiving surface of said light-activated semiconductor element, said second optical guide portion guiding the light signal from said first optical guide portion to said light receiving surface of said light-activated semiconductor element.

5. A light-activated semiconductor device according to claim 4, wherein the end face of said other end of said seoond optical guide portion is coated with a transparent elastic resin and abuts against said light receiving surface of said light-activated semiconductor element through said transparent elastic resin by a pressing means.

6. A light-activated semiconductor device according to claim 5, wherein said pressing means comprises a support member for supporting said other end of said second optical guide portion, and an elastic body disposed between said support member and said package to cause said other end of said second optical guide portion to abut against said light receiving surface through said support member.

7. A light-activated semiconductor device according to claim 6, wherein a portion of said support member made in contact with said second optical guide portion is made of a material selected a group consisting of aluminum, copper, silver and gold.

8. A light-activated semiconductor device according to claim 6, wherein a portion of said support member near said light receiving surface is provided with a means for providing a fixed gap between said other end of said second optical guide portion and said light receiving surface.

9. A light-activated semiconductor device according to claim 6, wherein said one end of said first optical guide portion within said package and said one end of said second optical guide portion are coupled in the mechanically flexible relation with each other by a first large-diameter member mounted on said one end of said first optical guide portion, a second large-diameter member mounted on said one end of said second optical guide portion and an engaging member engageable with said first and second large-diameter members.

10. A light-activated semiconductor device according to claim 9, wherein the end of said first optical guide portion within said package and the end face of said one end of said second optical guide portion is coated with a transparent elastic resin, both said end faces being in contact with each other through said transparent elastic resin.

11. A light-activated semiconductor device according to claim 4, wherein at least one of the end faces of said one end of said first optical guide portion within said package and the end face of said one end of said second optical guide portion is coated with a transparent elastic resin, both said end faces being in contact with each other through said transparent elastic resin.

12. A light-activated semiconductor device according to claim 4, wherein said one end of said first optical guide portion within said package and said one end of said second optical guide portion are coupled in the mechanically flexible relation with each other by a first large-diameter member mounted on said one end of said first optical guide portion, a second large-diameter member mounted on said one end of said second optical guide portion and an engaging member engageable with said first and second large-diameter members.

13. A light-activated semiconductor device according to claim 12, wherein at least one of the end face of said one end of said first optical guide portion within said package and the end face of said one end of said second optical guide portion is coated with a transparent elastic resin, both said end faces being in contact with each other through said transparent elastic resin.

14. A light-activated semiconductor device according to claim 1, wherein said second optical guide portion is disposed within said package so as to be movable with respect to said one end of said first optical guide portion and said light receiving surface of said light-activated semiconductor element.

15. A light-activated semiconductor device according to claim 14, wherein said second optical guide portion is disposed within said package so that said one end thereof is coupled in a mechanically flexible relation with said one end of said first optical guide portion, said one end of said second optical guide portion being at least rotatable about a longitudinal axis of said first optical guide portion or movable in a direction transverse to the longitudinal axis of said first optical guide portion.

16. A light-activated semiconductor device according to claim 4, wherein said second optical guide portion is disposed within said package so as to be movable with respect to said one end of said first optical guide portion and said light receiving surface of said light-activated semiconductor element.

17. A light-activated semiconductor device according to claim 16, wherein said second optical guide portion is disposed within said package so that said one end thereof is coupled in a mechanically flexible relation with said one end of said first optical guide portion, said one end of said second optical guide portion being at least rotatable about a longitudinal axis of said first optical guide portion or movable in a direction transverse to the longitudinal axis of said first optical guide portion.

* * * * *